United States Patent
BrightSky et al.

(10) Patent No.: US 10,211,054 B1
(45) Date of Patent: Feb. 19, 2019

(54) TONE INVERSION INTEGRATION FOR PHASE CHANGE MEMORY

(71) Applicant: International Business Machines Corporation, Armonk, NY (US)

(72) Inventors: Matthew J. BrightSky, Armonk, NY (US); Robert L. Bruce, White Plains, NY (US); John M. Papalia, New York, NY (US); HsinYu Tsai, San Jose, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/802,547

(22) Filed: Nov. 3, 2017

(51) Int. Cl.
| | |
|---|---|
| *H01L 45/00* | (2006.01) |
| *H01L 21/033* | (2006.01) |
| *H01L 21/24* | (2006.01) |
| *H01L 21/311* | (2006.01) |
| *H01L 27/24* | (2006.01) |
| *H01L 21/768* | (2006.01) |
| *H01L 21/02* | (2006.01) |

(52) U.S. Cl.
CPC .... *H01L 21/0337* (2013.01); *H01L 21/02417* (2013.01); *H01L 21/02485* (2013.01); *H01L 21/02568* (2013.01); *H01L 21/31144* (2013.01); *H01L 21/76816* (2013.01); *H01L 27/2436* (2013.01); *H01L 45/06* (2013.01); *H01L 45/1233* (2013.01); *H01L 45/141* (2013.01); *H01L 45/144* (2013.01); *H01L 45/1666* (2013.01); *H01L 45/1675* (2013.01)

(58) Field of Classification Search
CPC ... H01L 45/1666; H01L 45/06; H01L 45/144; H01L 45/141; H01L 45/1233; H01L 21/02417; H01L 21/10485; H01L 21/02568; H01L 21/0337; H01L 21/31144
See application file for complete search history.

(56) References Cited

U.S. PATENT DOCUMENTS

| | | | |
|---|---|---|---|
| 2007/0158632 | A1 | 7/2007 | Ho |
| 2008/0014676 | A1 | 1/2008 | Lung et al. |
| 2008/0142984 | A1 | 6/2008 | Chen |
| 2009/0130855 | A1 | 5/2009 | Fu et al. |
| 2010/0276657 | A1 | 11/2010 | Delhougne et al. |
| 2012/0040528 | A1* | 2/2012 | Kim ............... H01L 21/76816 438/675 |

OTHER PUBLICATIONS

List of IBM Patents or Patent Applictions Treated as Related; (Appendix P), Filed Jul. 26, 2018, 2 pages.

(Continued)

*Primary Examiner* — Thanhha Pham
(74) *Attorney, Agent, or Firm* — Cantor Colburn LLP; David Quinn

(57) ABSTRACT

Embodiments of the invention are directed to methods and resulting structures for forming a storage element using phase change memory (PCM). In a non-limiting embodiment of the invention, a PCM layer is formed over a surface of a bottom electrode. A top electrode is formed over the PCM layer using a tone inversion process that includes a sacrificial layer. A PCM pillar is then formed by patterning the PCM layer to expose a surface of the bottom electrode. The tone inversion process enables a sub-50 nm PCM pillar diameter.

17 Claims, 13 Drawing Sheets

(56) References Cited

OTHER PUBLICATIONS

Matthew J. BrightSky et al., Pending U.S. Appl. No. 16/045,788 entitled "Tone Inversion Integration for Phase Change Memory," filed with the U.S. Patent and Trademark Office on Jul. 26, 2018.

BrightSky et al. "Crystalline-as-deposited ALD phase change material confined PCM cell for high density storage class memory," Proc. IEEE IEDM, pp. 3-6, (2015).

Bruce et al. "Directed self-assembly patterning strategies for phase change memory applications". Proc. SPIE Conf. on Advanced Lithography, vol. 10149, pp. 101490J-1-101490J-10, (2017).

Feng et al. "Dry Etching of Nanosized Ge1Sb2Te4 Patterns Using TiN Hard Mask for High Density Phase-Change Memory", Journal of nanoscience and nanotechnology, vol. 9, No. 2, pp. 1526-1529, (2009).

Joseph et al. "Patterning of N:Ge2Sb2Te5 Films and the Characterization of Etch Induced Modification for Non-volatile phase change memory applications," IEEE International Symposium on VLSI Technology, Systems and Applications, (VLSI-TSA 200). pp. 142-143 (2008).

Li et al. "Direct evidence of reactive ion etching induced damages in Ge2Sb2Te5 based on different halogen plasmas", Applied Surface Science, 378, pp. 163-166 (2016).

Song et al. "A study of GST etching process for phase change memory application," IEEE Intl. Conf. on Semiconductor Technology (CSTIC 2016 China), pp. 1-3 (2016).

Xia et al. "Etching characteristics of phase change material GeTe in inductively coupled BCl3/Ar plasma for phase Thange memory," Microelectronic Engineering, 161, pp. 69-73 (2016).

Yoon et al. "Dry etching of Ge2Sb2Te5 thin films into nanosized patterns using TiN hard mask," Japanese Journal of Applied Physics, vol. 45, No. 40, 2006, pp. L1080-L1083.

\* cited by examiner

TONE INVERSION INTEGRATION FOR PHASE CHANGE MEMORY

BACKGROUND

The present invention generally relates to fabrication methods and resulting structures for semiconductor devices. More specifically, the present invention relates to a tone inversion integration process for forming phase change memory.

Phase Change Memory (PCM) is an emerging technology for storage class memory and is also an attractive candidate for memory-based machine-learning accelerators for cognitive computing. Phase change based memory materials such as the chalcogenides (alloys of elements of group VI of the periodic table) can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable phase change based materials to form non-volatile memory circuits, which can be read and written with random access.

PCM materials typically include a composition of elements (e.g., two to six), and the functionality of a PCM material is highly dependent on the particular composition of elements that is selected. In a storage element that relies on PCM, data is stored by causing transitions in an active region of the phase change material between amorphous and crystalline states. For a one bit cell, the difference between the highest resistance of the low resistance crystalline set state and the lowest resistance of the high resistance amorphous reset state defines a read margin used to distinguish cells in the crystalline set state from those in the amorphous reset state. The data stored in a memory cell can be determined by determining whether the memory cell has a resistance corresponding to the low resistance state or to the high resistance state, for example by measuring whether the resistance of the memory cell is above or below a threshold resistance value within the read margin.

SUMMARY

Embodiments of the present invention are directed to a method for forming phase change memory (PCM). A non-limiting example of the method includes forming a PCM layer over a surface of a bottom electrode. A top electrode is formed over the PCM layer using a tone inversion process that includes a sacrificial layer. A PCM pillar is then formed by patterning the PCM layer to expose a surface of the bottom electrode. The tone inversion process enables a sub-50 nm PCM pillar diameter.

Embodiments of the present invention are directed to a method for forming PCM. A non-limiting example of the method includes forming a PCM layer over a surface of a bottom electrode. An etch stop layer is formed over the PCM layer and a sacrificial layer is formed over the etch stop layer. The sacrificial layer is patterned to form a cavity exposing a surface of the etch stop layer. A top electrode is formed within the cavity and the sacrificial layer is removed. A PCM pillar is formed by patterning the PCM layer to expose a surface of the bottom electrode.

Embodiments of the invention are directed to a PCM. A non-limiting example of the PCM includes a bottom electrode. A PCM pillar is formed over a surface of the bottom electrode. The PCM pillar includes a diameter of about 10 nm to about 50 nm. An etch stop layer is formed over the PCM pillar and a ring electrode is formed over the etch stop layer. The ring electrode includes three stacked electrode layers.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
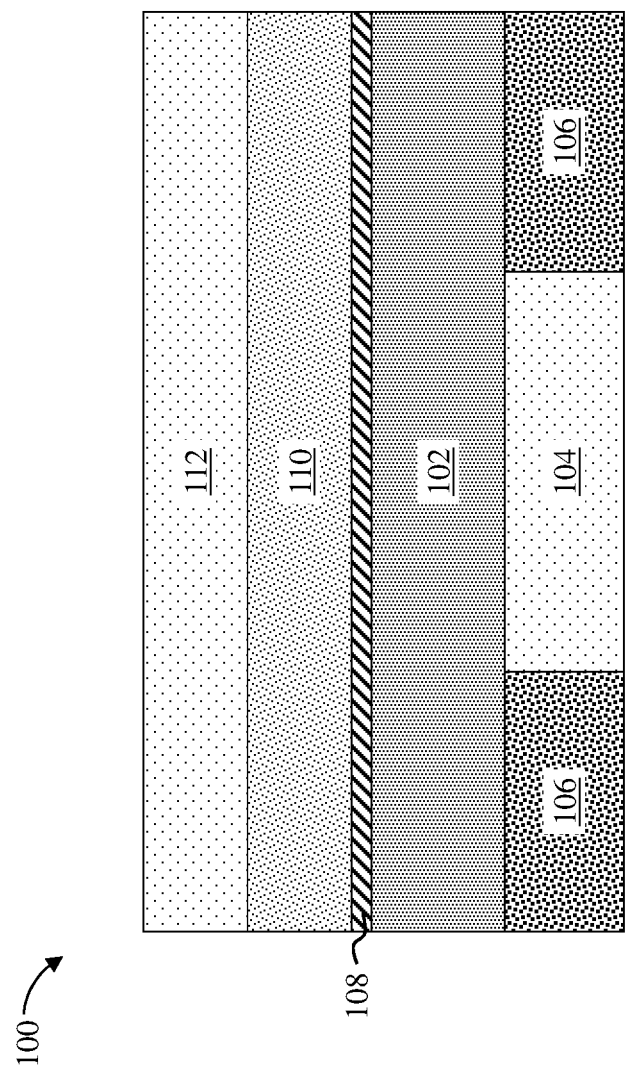
FIG. 1 depicts a cross-sectional view of a semiconductor structure after a processing operation according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments, the various elements illustrated in the figures are provided with two or three

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, PCM-based memory materials such as the chalcogenides (alloys of elements of group VI of the periodic table) can be caused to change phase between an amorphous state and a crystalline state by application of electrical current. PCM offers many advantages over its closest competitor, flash memory, which is already in widespread use. Like flash memory, PCM is non-volatile. PCM, however, is bit alterable, meaning that information can be written directly without the need for an erase process. This gives PCM a significant advantage over flash memory, which requires an erase cycle before new data can be written. PCM also offers higher read/write performance than flash memory. Accordingly, the integration of PCMs into storage class memory and memory-based machine-learning is highly attractive. There are challenges, however, in sufficiently scaling PCM for integration into advanced technology nodes (i.e., sub-50 nm). One such challenge is the difficulty in lithographically patterning PCM materials. PCM materials are highly volatile during reactive ion etching (RIE), especially when combined with chemical etching processes. Consequently, conventional PCM fabrication processes are restricted to larger technology nodes or are required to overdesign PCM stack dimensions to accommodate the anticipated damage.

Turning now to an overview of aspects of the present invention, one or more embodiments of the invention provide a tone inversion integration process for forming a storage element using PCM. Tone inversion refers to the use of a sacrificial layer for etch mask patterning during fabrication. During a tone inversion process a high aspect ratio (i.e., an aspect ratio of greater than about 2) tone inversion etch mask is formed by filling a cavity in a sacrificial material (e.g., $SiO_2$/Si) with a mask material and then removing the layer. In some embodiments of the present invention, tone inversion is performed by filling a high aspect ratio cavity with layers of a ring electrode. The ring electrode is separated from a PCM layer by a thin protective etch stop layer (e.g., about 5 nm thick) that can be etched through without damaging the PCM material. Tone inversion integration enables PCM pillar formation using reactive ion etching down to sub-50 nm dimensions without damaging PCM materials on the edges of the PCM pillars. In other words, scaling PCM to sub-50 nm memory architectures is achievable when using a tone inversion process.

Turning now to a more detailed description of aspects of the present invention, FIG. 1 depicts a cross-sectional view of a structure 100 during an intermediate operation of a method of fabricating a semiconductor device according to one or more embodiments of the invention. As depicted in FIG. 1, a partially fabricated semiconductor device can include a PCM layer 102 formed over a bottom electrode 104. The PCM layer 102 can include any suitable PCM material. In some embodiments of the present invention, the PCM layer 102 includes a chalcogenide glass such as, for example, a germanium-antimony-tellurium (GST) ternary compound. Germanium-antimony-tellurium based compounds can include, for example, $Ge_2Sb_2Te_5$ and $Ge_1Sb_3Te_5$. In some embodiments of the present invention, the PCM layer 102 includes a germanium-deficient GST ternary compound. The germanium-deficient GST compound can have less than 50%, 40%, 30%, 20% of the germanium present in undoped $Ge_2Sb_2Te_5$. The PCM layer 102 can be formed over the bottom electrode 104 using any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE), atomic layer deposition (ALD), physical vapor deposition (PVD), or other like processes. The PCM layer 102 can be formed to a thickness of less than about 50 nm, for example, 40, 30, 20, 10 nm, although other thicknesses are within the contemplated scope of the invention.

The bottom electrode 104 can include any suitable electrode material such as, for example, TiN, TaN, W, Cu, or a combination thereof. In some embodiments of the present invention, the bottom electrode 104 is TiN. The bottom electrode 104 can be formed between sidewalls of a dielectric layer 106. The insulating layer 106 electrically and thermally insulates the bottom electrode 104, drastically reducing heat loss and improving efficiency. The insulating layer 106 can include any suitable dielectric material, including but not limited to a silicon oxide, a silicon nitride, or a silicon oxynitride. In some embodiments of the present invention, the insulating layer 106 is SiN.

An etch stop layer 108 is formed over the PCM layer 102. As discussed previously herein, the etch stop layer 108 material is selected such that the etch stop layer 108 can be removed without damaging the PCM layer 102. In other words, the etch stop layer 108 is selected such that it can be removed selective to the PCM layer 102. In some embodiments of the present invention, the PCM layer 102 includes a GST ternary compound and the etch stop layer 108 is TiN. The etch stop layer 108 is formed to a thickness of less than about 10 nm, for example, 5 nm. The etch stop layer 108 can be formed using any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE), atomic layer deposition (ALD), physical vapor deposition (PVD), or other like processes.

A sacrificial layer is formed over the etch stop layer 108. In some embodiments of the present invention, the sacrificial layer is a two-layer stack having a first sacrificial layer 110 and a second sacrificial layer 112. In some embodiments of the present invention, the first sacrificial layer 110 is composed of amorphous or polycrystalline Si. In some embodiments of the present invention, the second sacrificial layer 112 includes a dielectric material, such as, for example, a silicon oxide, a silicon nitride, or a silicon oxynitride. In some embodiments of the present invention, the first sacrificial layer 110 is Si and the second sacrificial layer 112 is $SiO_2$, although other known sacrificial film compositions are within the contemplated scope of the invention. The first and second sacrificial layers 110 and 112 can be formed using any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE), atomic layer deposition (ALD), physical vapor deposition (PVD), or other like processes.

Figure 2:
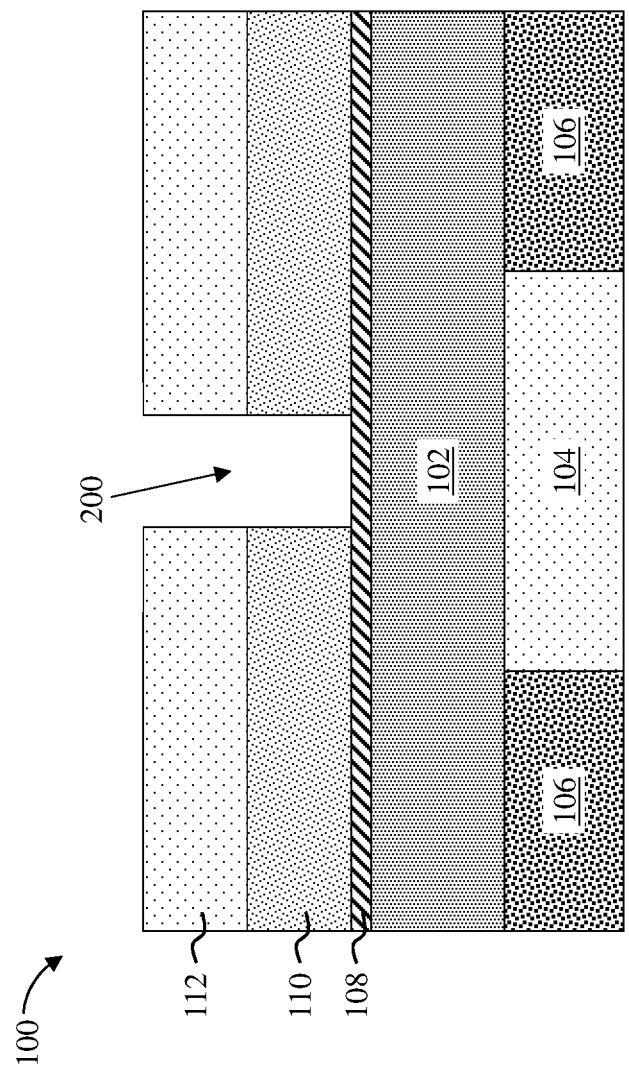
FIG. 2 depicts a cross-sectional view of a semiconductor structure after a processing operation according to one or more embodiments of the invention.

FIG. 2 depicts a cross-sectional view of the structure 100 after patterning the first sacrificial layer 110 and the second sacrificial layer 112 to form a cavity 200 during an intermediate operation of the exemplary method of fabricating a semiconductor device according to one or more embodiments of the invention. As depicted in FIG. 2, portions of the first sacrificial layer 110 and the second sacrificial layer 112 are removed to expose a surface of the etch stop layer 108. The first sacrificial layer 110 and the second sacrificial layer 112 can be patterned by any lithographic process or etching methodology, such as, for example, a wet etch, a dry etch, or a combination of sequential wet and/or dry etches. The lithographic process can include applying a photoresist (not depicted) over the second sacrificial layer 110, exposing portions of the photoresist to a desired pattern of radiation, and developing the exposed portions of photoresist. The pattern can then be transferred to the first sacrificial layer 110 and the second sacrificial layer 112 using, for example, RIE. In some embodiments of the present invention, the first sacrificial layer 110 and the second sacrificial layer 112 are patterned using a via hole shrink and transfer process. In this manner the trench 200 can be patterned to a diameter of less than 100 nm, for example, about 40 nm to 60 nm. In some embodiments of the present invention, the trench 200 is patterned to a diameter of less than about 50 nm, for example, 30 nm, 20 nm, or 10 nm, although other diameters are within the contemplated scope of the invention.

Figure 3:
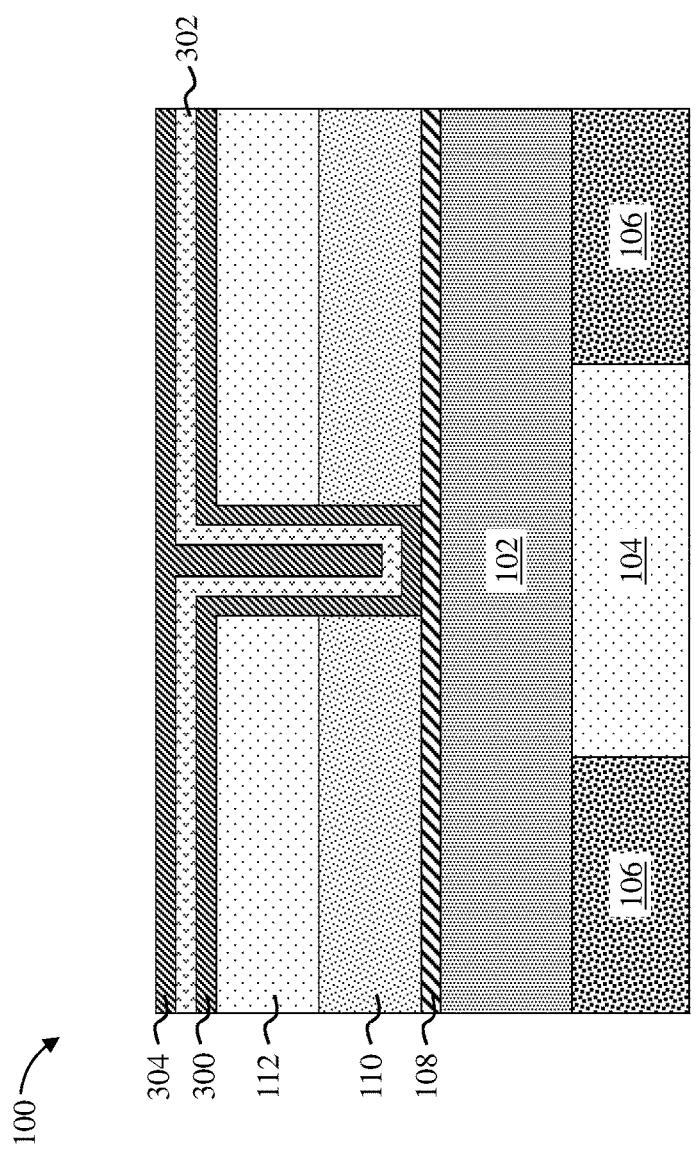
FIG. 3 depicts a cross-sectional view of a semiconductor structure after a processing operation according to one or more embodiments of the invention.

FIG. 3 depicts a cross-sectional view of the structure 100 after a ring electrode fill during an intermediate operation of the exemplary method of fabricating a semiconductor device according to one or more embodiments of the invention. As depicted in FIG. 3, a first electrode layer 300, a second electrode layer 302, and a third electrode layer 304 are formed over the first and second sacrificial layers 110 and 112. Portions of the first electrode layer 300, second electrode layer 302, and third electrode layer 304 fill the trench 200. The first electrode layer 300, second electrode layer 302, and third electrode layer 304 can each be formed using any suitable electrode material. In some embodiments of the present invention, the first electrode layer 300, second electrode layer 302, and third electrode layer 304 are metal nitride layers, for example, TaN or TiN. In some embodiments of the present invention, the first electrode layer 300 and the third electrode layer 304 are a first material and the second electrode layer 302 is a second material. In some embodiments of the present invention, the first electrode layer 300 and the third electrode layer 304 include TaN and the second electrode layer 302 includes TiN.

In some embodiments of the present invention, the first electrode layer 300, second electrode layer 302, and third electrode layer 304 are formed in succession over the structure 100 using a conformal deposition process, for example, atomic layer deposition. Each of the first, second, and third electrode layers 300, 302, and 304 can be conformally deposited to a thickness of between about 2 angstroms to about 200 angstroms, although other thicknesses are within the contemplated scope of the invention. In some embodiments of the present invention, the first electrode layer 300 and the second electrode layer 302 are each formed to a desired thickness and the third electrode layer 304 is formed to a thickness sufficient to fill a remaining portion of the trench 200. As discussed previously herein, the trench 200 can have a diameter of about 40 nm to about 60 nm. Accordingly, in some embodiments of the present invention, the total diameter of the first, second, and third electrode layers 300, 302, and 304 which fill the trench 200 is about 40 nm to about 60 nm.

Figure 4:
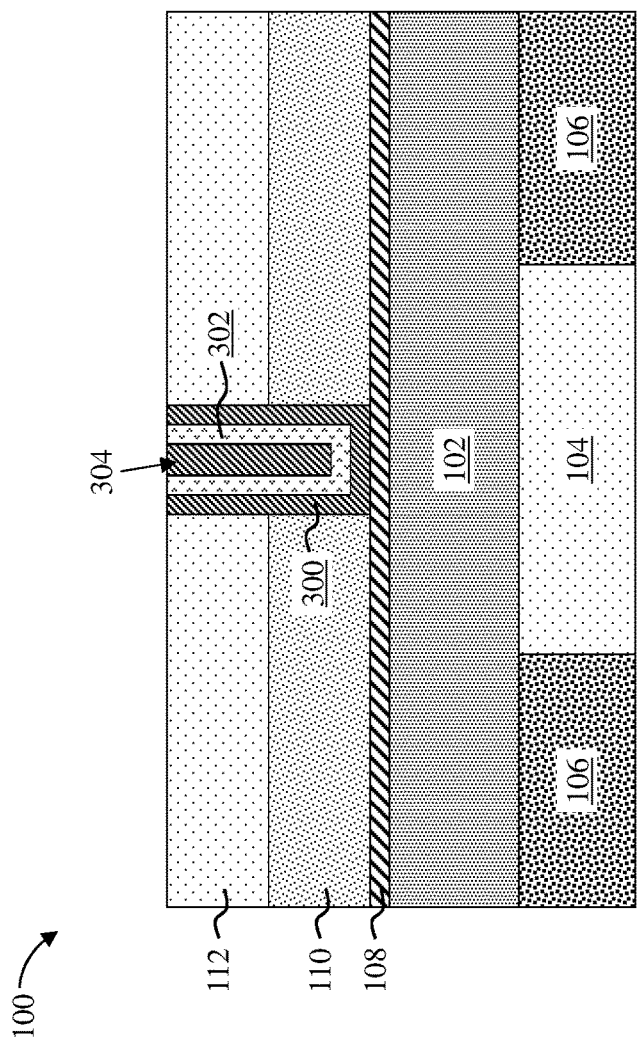
FIG. 4 depicts a cross-sectional view of a semiconductor structure after a processing operation according to one or more embodiments of the invention.

FIG. 4 depicts a cross-sectional view of the structure 100 after a ring electrode polish or etch back during an intermediate operation of the exemplary method of fabricating a semiconductor device according to one or more embodiments of the invention. As depicted in FIG. 4, the first, second, and third electrode layers 300, 302, and 304 are planarized to a surface of the second sacrificial layer 112. The first, second, and third electrode layers 300, 302, and 304 can be planarized using, for example, CMP. In some embodiments of the present invention, the CMP is selective to the second sacrificial layer 112. The remaining portions of the first electrode layer 300, second electrode layer 302, and third electrode layer 304 (i.e., those portions that filled the trench 200) collectively define a ring electrode (also known as a top electrode). In some embodiments, the first, second and third electrode layers can be planarized by RIE.

Figure 5:
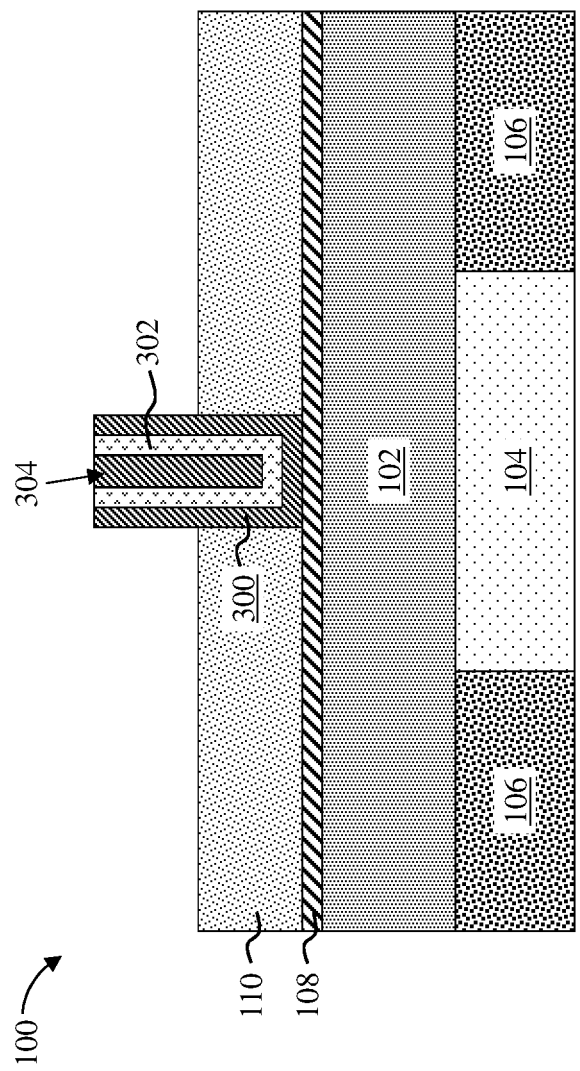
FIG. 5 depicts a cross-sectional view of a semiconductor structure after a processing operation according to one or more embodiments of the invention.

FIG. 5 depicts a cross-sectional view of the structure 100 after removing the second sacrificial layer 112 during an intermediate operation of the exemplary method of fabricating a semiconductor device according to one or more embodiments of the invention. The second sacrificial layer 112 can be removed using any suitable process, such as a wet etch, a dry etch, or a combination thereof. In some embodiments of the present invention, the second sacrificial layer 112 is selectively etched using a buffered hydrofluoric acid solution (BHF). The BHF solution can include, for example, 6 volumes of ammonium fluoride ($NH_4F$, 40% solution) to 1 volume of hydrofluoric acid.

Figure 6:
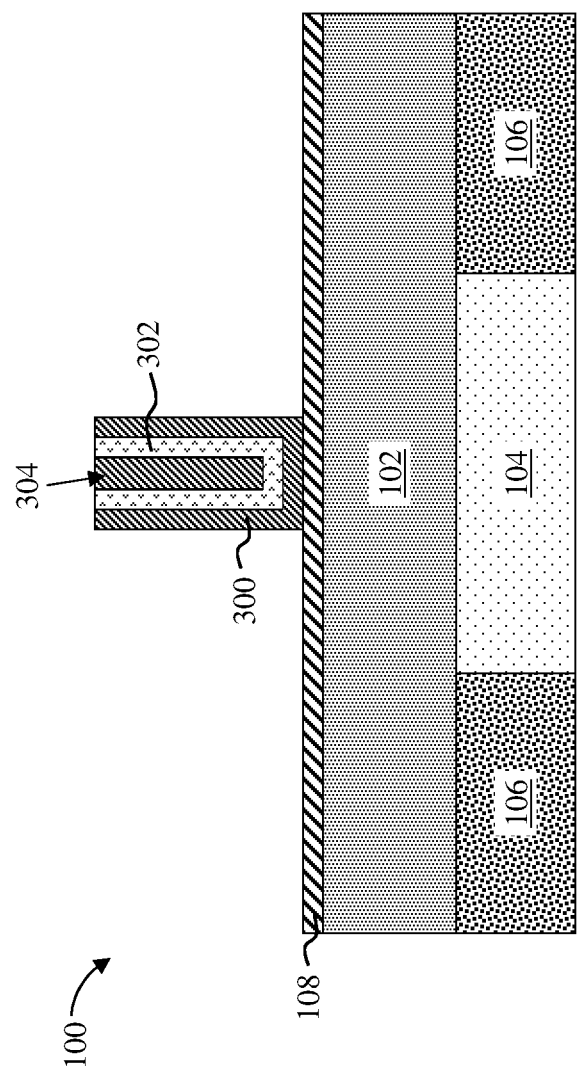
FIG. 6 depicts a cross-sectional view of a semiconductor structure after a processing operation according to one or more embodiments of the invention.

FIG. 6 depicts a cross-sectional view of the structure 100 after removing the first sacrificial layer 110 during an intermediate operation of the exemplary method of fabricating a semiconductor device according to one or more embodiments of the invention. As shown in FIG. 6, the first sacrificial layer 110 is removed to expose a surface of the etch stop layer 108. The first sacrificial layer 110 can be removed using any suitable process, such as a wet etch, a dry etch, or a combination thereof. In some embodiments of the present invention, the first sacrificial layer 110 is etched using a RIE. In some embodiments of the present invention, the first sacrificial layer 110 includes silicon and is etched selective to the etch stop layer 108 using a sulfur hexafluoride (SF6) RIE.

Figure 7:
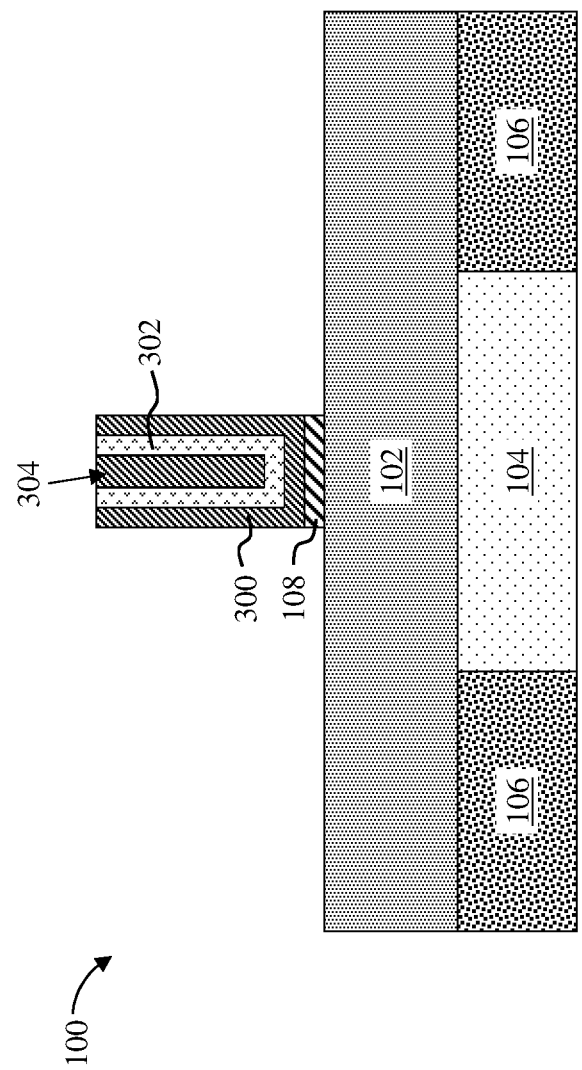
FIG. 7 depicts a cross-sectional view of a semiconductor structure after a processing operation according to one or more embodiments of the invention.

FIG. 7 depicts a cross-sectional view of the structure 100 after removing exposed portions of the etch stop layer 108 during an intermediate operation of the exemplary method of fabricating a semiconductor device according to one or more embodiments of the invention. As shown in FIG. 7, the etch stop layer 108 is patterned to expose a surface of the PCM layer 102. The etch stop layer 108 can be removed using any suitable process, such as a wet etch, a dry etch, or a combination thereof. As discussed previously herein, in some embodiments of the present invention the etch stop layer 108 material is selected such that the etch stop layer 108 can be etched selective to the PCM layer 102. In some embodiments of the present invention, exposed portions of the etch stop layer 108 are etched selective to the PCM layer 102 using a RIE. In this manner the remaining portions of the etch stop layer 108 and the electrode layers 300, 302, and 304 collectively form a hard mask over portions of the PCM layer 102.

Figure 8:
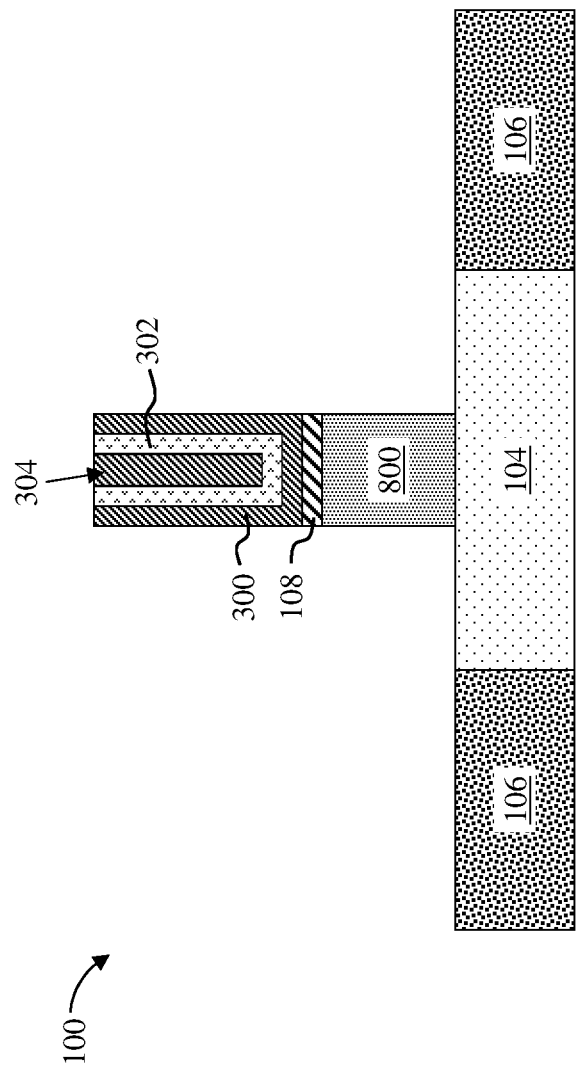
FIG. 8 depicts a cross-sectional view of a semiconductor structure after a processing operation according to one or more embodiments of the invention.

FIG. 8 depicts a cross-sectional view of the structure 100 after patterning the PCM layer 102 during an intermediate operation of the exemplary method of fabricating a semiconductor device according to one or more embodiments of the invention. As shown in FIG. 8, the PCM layer 102 is patterned to expose a surface of the bottom electrode 104 and the dielectric layer 106. The PCM layer 102 can be patterned using a wet etch, a dry etch, or a combination thereof. In some embodiments of the present invention, the PCM layer 102 is patterned selective to the bottom electrode 104 and/or the dielectric layer 106.

As discussed previously herein, the remaining portions of the electrode layers 300, 302, and 304 collectively define a ring electrode formed over portions of the etch stop layer 108 and the PCM layer 102. Accordingly, the PCM layer 102 can be patterned using a RIE while the etch stop layer 108 and the ring electrode (i.e., those remaining portions of the electrode layers 300, 302, and 304) serve as an etch mask. The remaining portion of the PCM layer 102 (i.e., the portion under the ring electrode) defines a PCM pillar 800. In some embodiments of the present invention, the PCM pillar 800 is patterned using argon (Ar) RIE. An Ar RIE is possible due to the high aspect ratio afforded by the tone inversion process. In other embodiments of the present invention, the PCM pillar 800 is patterned using a $CF_4/CHF_3$ RIE, an $Ar/Cl_2/CHF_3$ RIE, an $Ar/BCl_3$ RIE, or an Ar/HBr RIE. As discussed previously herein, the trench 200 (depicted in FIG. 2) can have a diameter of less than about 100 nm, for example 40 nm to 60 nm. Accordingly, in some embodiments of the present invention, the diameter of the PCM pillar 800 can be less than about 100 nm, for example, about 10 nm to about 60 nm, although other diameters are within the contemplated scope of the invention.

Figure 9:
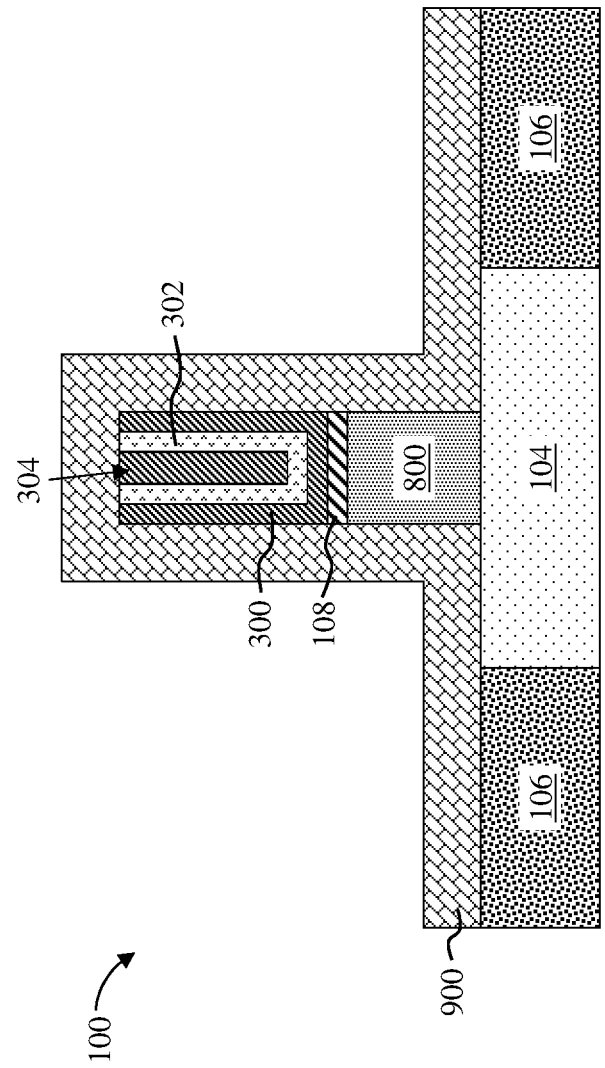
FIG. 9 depicts a cross-sectional view of a semiconductor structure after a processing operation according to one or more embodiments of the invention.

FIG. 9 depicts a cross-sectional view of the structure 100 after a first dielectric layer 900 fill during an intermediate operation of the exemplary method of fabricating a semiconductor device according to one or more embodiments of the invention. The first dielectric layer 900 can be any suitable dielectric material, such as, for example, a silicon nitride, and can be formed using any suitable process, such as plasma enhanced chemical vapor deposition (PECVD), inductively coupled plasma chemical vapor deposition (ICP CVD), reactive ion beam deposition (RIBD), physical vapor deposition (PVD), or atomic layer deposition. In some embodiments of the present invention, the first dielectric layer 900 is conformally formed using atomic layer deposition. In some embodiments of the present invention, the first dielectric layer 900 is SiN deposited using PECVD at a temperature of about 200 degrees Celsius. The first dielectric layer 900 can be conformally deposited to a thickness of between about 2 angstroms to about 200 angstroms, although other thicknesses are within the contemplated scope of the invention.

Figure 10:
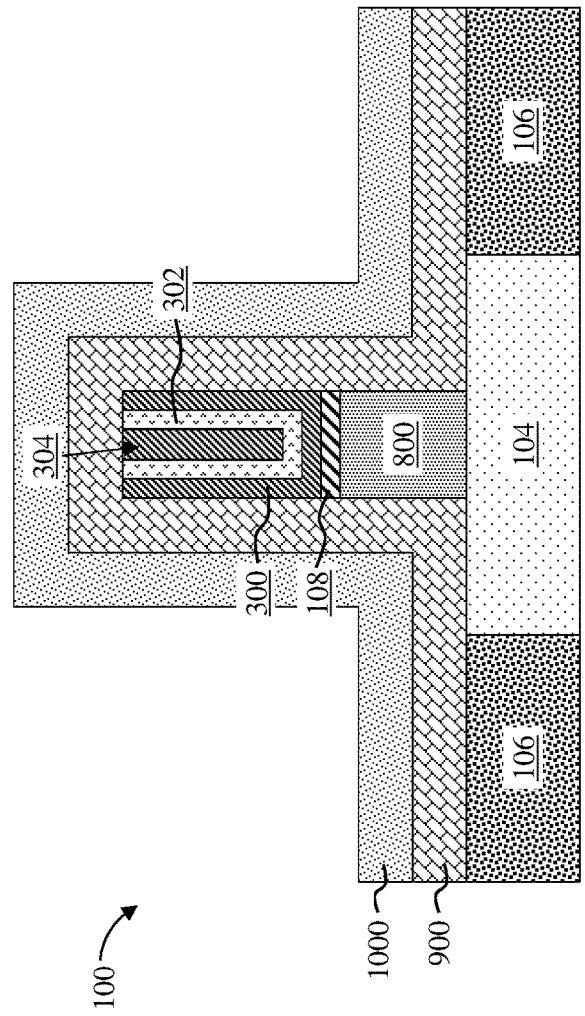
FIG. 10 depicts a cross-sectional view of a semiconductor structure after a processing operation according to one or more embodiments of the invention.

FIG. 10 depicts a cross-sectional view of the structure 100 after a second dielectric layer 1000 fill during an intermediate operation of the exemplary method of fabricating a semiconductor device according to one or more embodiments of the invention. The second dielectric layer 1000 can be any suitable dielectric material, such as, for example, a silicon nitride, and can be formed using any suitable process, such as PECVD, ICP CVD, RIBD, PVD, or atomic layer deposition. In some embodiments of the present invention, the second dielectric layer 1000 is a same material as the first dielectric layer 900. In other embodiments of the present invention, the first dielectric layer 900 and the second dielectric layer 1000 are dissimilar dielectrics.

In some embodiments of the present invention, the second dielectric layer 1000 is conformally formed using atomic layer deposition. In some embodiments of the present invention, the second dielectric layer 1000 is SiN deposited using PECVD at a greater temperature than that used to form the first dielectric layer 900. For example, the second dielectric layer 1000 can be formed at a temperature of about 400 degrees Celsius, although other temperatures are within the contemplated scope of the invention. The second dielectric layer 1000 can be deposited to a thickness of between about 2 angstroms to about 200 angstroms, although other thicknesses are within the contemplated scope of the invention. In some embodiments of the present invention, the second dielectric layer 1000 is formed to a substantially same thickness as the first dielectric layer 900. In other embodiments of the present invention, the second dielectric layer 1000 is formed to greater thickness than the first dielectric layer 900.

Figure 11:
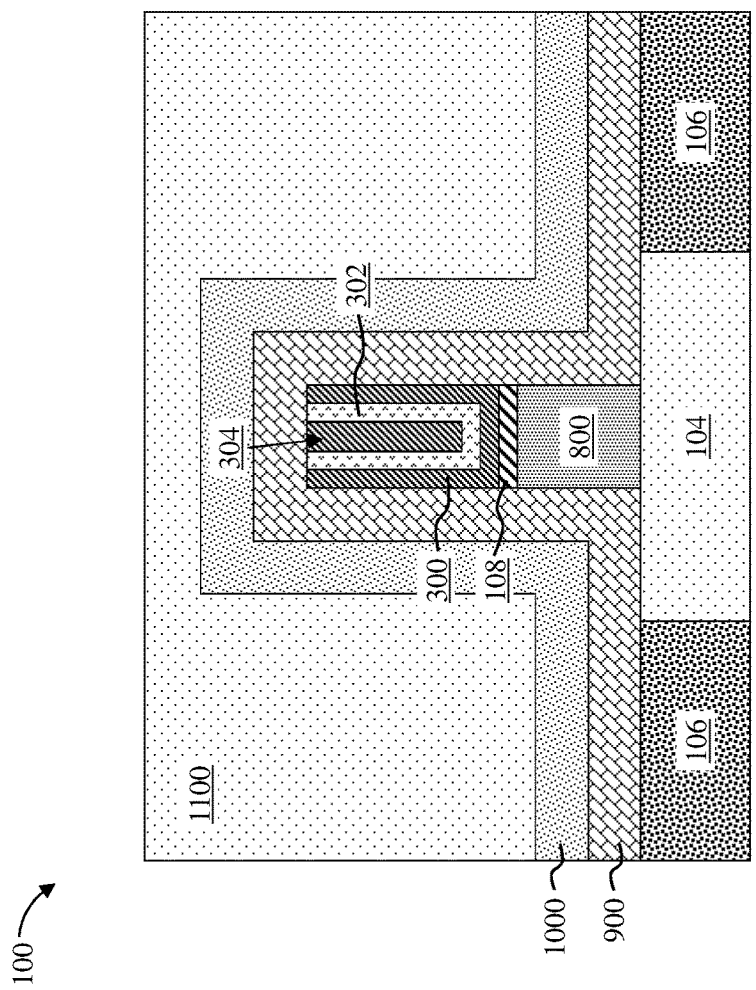
FIG. 11 depicts a cross-sectional view of a semiconductor structure after a processing operation according to one or more embodiments of the invention.

FIG. 11 depicts a cross-sectional view of the structure 100 after an interlayer dielectric 1100 fill during an intermediate operation of the exemplary method of fabricating a semiconductor device according to one or more embodiments of the invention. The interlayer dielectric 1100 can be any suitable dielectric material, such as, for example, a silicon nitride, a silicon oxide, or tetraethyl orthosilicate (TEOS, also known as tetraethoxysilane), and can be formed using any suitable process, such as PECVD, ICP CVD, RIBD, PVD, or atomic layer deposition. In some embodiments of the present invention, the interlayer dielectric 1100 is deposited over the structure 100 using CVD. In some embodiments of the present invention, the interlayer dielectric 1100 is TEOS deposited using CVD. The interlayer dielectric 1100 can be deposited to a thickness of between about 1000 angstroms to about 8000 angstroms, although other thicknesses are within the contemplated scope of the invention. In some embodiments of the present invention, the second dielectric layer 1000 is conformally formed to a substantially same thickness as the first dielectric layer 900 or the second dielectric layer 1000. In other embodiments of the present invention, the interlayer dielectric 1100 is formed to greater thickness than the first dielectric layer 900 or the second dielectric layer 1000.

Figure 12:
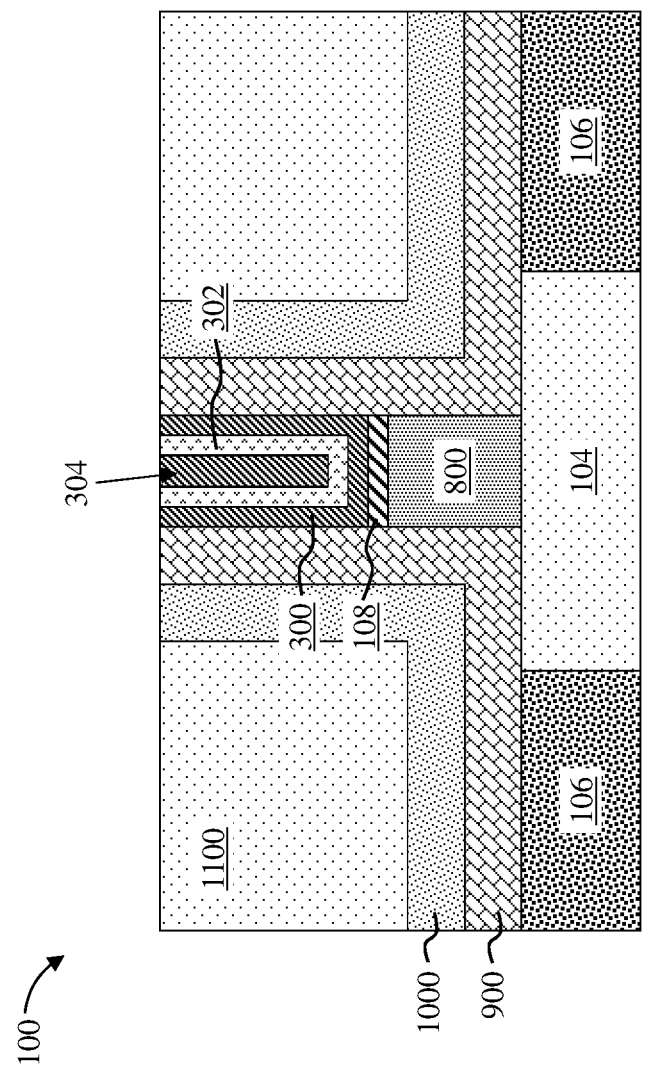
FIG. 12 depicts a cross-sectional view of a semiconductor structure after a processing operation according to one or more embodiments of the invention.

FIG. 12 depicts a cross-sectional view of the structure 100 after polishing during an intermediate operation of the exemplary method of fabricating a semiconductor device according to one or more embodiments of the invention. As depicted in FIG. 12, the first dielectric layer 900, the second dielectric layer 1000, and the interlayer dielectric 1100 are planarized to a top surface of the ring electrode (i.e., the first, second, and third electrode layers 300, 302, and 304). The structure 100 can be planarized to the top surface of the ring electrode using, for example, CMP. In some embodiments of the present invention, the CMP is selective to one or more of the first, second, and third electrode layers 300, 302, and 304.

Figure 13:
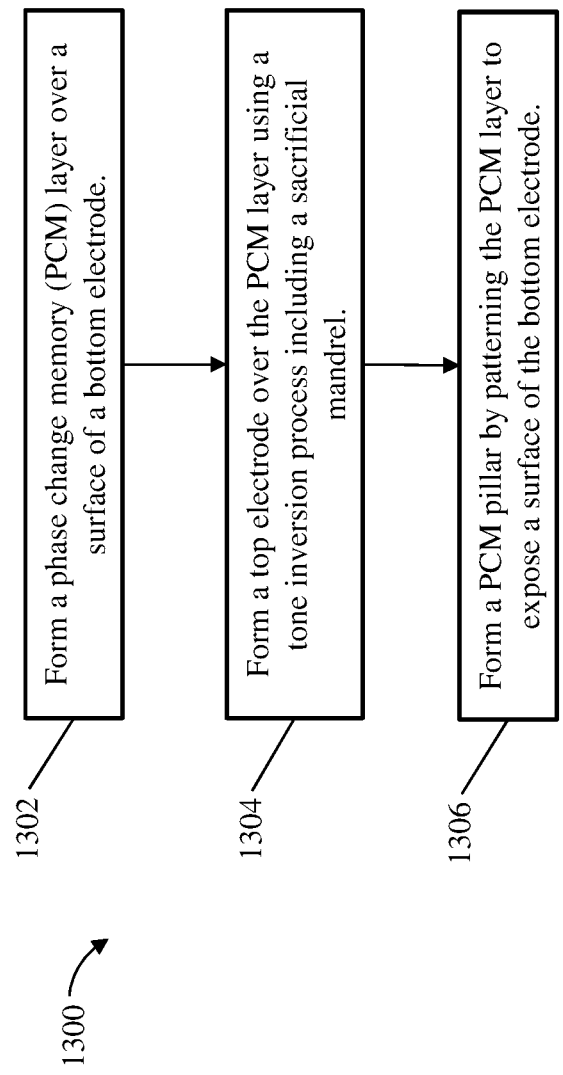
FIG. 13 depicts a flow diagram illustrating a method according to one or more embodiments of the invention.

FIG. 13 depicts a flow diagram 1300 illustrating a method for phase change memory pillar formation according to one or more embodiments of the invention. As shown at block 1302, a PCM layer is formed over a surface of a bottom electrode. The PCM layer can be formed in a similar manner as the PCM layer 102 (as depicted in FIG. 1) according to one or more embodiments.

As shown at block 1304, a top electrode is formed over the PCM layer using a tone inversion process. As discussed previously herein, tone inversion refers to the use of a sacrificial layer for etch mask patterning during fabrication. During the tone inversion process a high aspect ratio (i.e., an aspect ratio of greater than about 2) cavity is formed in the sacrificial layer material. The cavity is filled with the top electrode layers and the sacrificial layer is then removed (as depicted in FIGS. 2-6).

As shown at block 1306, a PCM pillar is formed by patterning the PCM layer to expose a surface of the bottom electrode. The PCM pillar can be formed in a similar manner as the PCM pillar 800 (as depicted in FIG. 8) according to one or more embodiments. In some embodiments of the present invention, the PCM pillar is formed using an argon-based RIE.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing of the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and can not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
   forming a phase change memory (PCM) layer over a surface of a bottom electrode;
   forming a top electrode over the PCM layer using a tone inversion process comprising the formation of a sacrificial layer; and
   forming a PCM pillar by patterning the PCM layer to expose a surface of the bottom electrode.

2. The method of claim 1, wherein the top electrode serves as an etch mask while forming the PCM pillar.

3. The method of claim 1, wherein the PCM pillar comprises a germanium-antimony-tellurium (GST) ternary compound.

4. The method of claim 1, wherein the top electrode comprises a three layer ring electrode.

5. The method of claim 1, wherein the sacrificial layer comprises a two layer layer stack having a first sacrificial layer and a second sacrificial layer.

6. The method of claim 1, wherein the bottom electrode is electrically isolated between two portions of a dielectric layer.

7. The method of claim 1, wherein the tone inversion process further comprises forming a high aspect ratio hard mask by filling a trench in the sacrificial layer.

8. The method of claim 1, wherein the PCM pillar comprises a diameter of less than about 60 nm.

9. The method of claim 1, wherein the PCM pillar comprises a diameter of about 10 nm to about 60 nm.

10. A method for forming a semiconductor device, the method comprising:
    forming a phase change memory (PCM) layer over a surface of a bottom electrode;

forming an etch stop layer over the PCM layer;
forming a sacrificial layer over the etch stop layer;
forming a trench to expose a surface of the etch stop layer;
forming a top electrode over the sacrificial layer, a portion of the top electrode filling the trench;
removing the sacrificial layer; and
forming a PCM pillar by patterning the PCM layer to expose a surface of the bottom electrode.

11. The method of claim 10 further comprising forming a dielectric layer over a top surface of the top and bottom electrodes.

12. The method of claim 11 further comprising planarizing the dielectric layer to the top surface of the top electrode.

13. The method of claim 10, wherein the top electrode comprises a three layer ring electrode.

14. The method of claim 10, wherein the sacrificial layer comprises a two layer layer stack having a first sacrificial layer and a second sacrificial layer.

15. The method of claim 10, wherein the bottom electrode is electrically isolated between two portions of a dielectric layer.

16. The method of claim 10, wherein the tone inversion process further comprises forming a high aspect ratio hard mask by filling a trench in the sacrificial layer.

17. The method of claim 10, wherein the PCM pillar comprises a diameter of about 10 nm to about 60 nm.

* * * * *